United States Patent
Inoue et al.

(10) Patent No.: US 6,845,254 B2
(45) Date of Patent: Jan. 18, 2005

(54) NB$_3$GA MULTIFILAMENTARY SUPERCONDUCTING WIRE AND PROCESS FOR PREPARING THE SAME

(75) Inventors: Kiyoshi Inoue, Ibaraki (JP); Yasuo Iijima, Ibaraki (JP); Akihiro Kikuchi, Ibaraki (JP); Yuji Yoshida, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 10/397,198

(22) Filed: Mar. 27, 2003

(65) Prior Publication Data

US 2004/0028886 A1 Feb. 12, 2004

(30) Foreign Application Priority Data

Mar. 28, 2002 (JP) ......................................... 2002-092654

(51) Int. Cl.$^7$ ........................... H01B 12/00; H01F 6/00; H01L 39/00; C21D 1/00
(52) U.S. Cl. ........................ 505/231; 505/237; 505/431; 148/98
(58) Field of Search ................................. 505/230, 231, 505/232, 237, 431, 434, 500; 428/699, 930, 607; 438/2; 174/125.1; 148/95, 96, 98

(56) References Cited

U.S. PATENT DOCUMENTS

| | | | | |
|---|---|---|---|---|
| 3,958,327 A | * | 5/1976 | Marancik et al. ............. 29/599 |
| 3,983,521 A | * | 9/1976 | Furuto et al. ................ 335/216 |
| 4,411,959 A | * | 10/1983 | Braginski et al. ............ 428/558 |
| 4,575,927 A | * | 3/1986 | Braginski et al. ............. 29/599 |
| 5,174,831 A | * | 12/1992 | Wong et al. ................... 148/98 |
| 5,454,163 A | * | 10/1995 | McDonald et al. ..... 29/890.032 |
| 5,654,098 A | * | 8/1997 | Aono et al. .................. 428/373 |

OTHER PUBLICATIONS

Inoue et al., "A new practical superconductor: rapidly heated and quenched Nb3Ga wire" Physica C 384 (2003), pp. 267–273.*

Inoue et al., "Development of rapidly heated and quenched Nb3Ga wire" Supercond. Sci. Technol. 17 (Apr. 6, 2004), pp. S311–S314.*

* cited by examiner

*Primary Examiner*—Stanley S. Silverman
*Assistant Examiner*—Colleen P. Cooke
(74) *Attorney, Agent, or Firm*—Wenderoth, Lind & Ponack, L.L.P.

(57) ABSTRACT

By rapidly heating a precursor wire having a multifilamentary structure in which multiple composite cores in which a composite compound of an Nb—Ga compound and Nb is embedded in Nb are embedded in Nb, Ta, Nb-base alloy or Ta-base alloy as a matrix material to a temperature range of 1400 to 2100° C. in 2 seconds, quenching the precursor wire at a rate of 5000° C./second or larger, and subjecting the precursor wire to additional heat treatment at a temperature range of 600 to 850° C. for 1 to 400 hours, a superconducting wire having a multifilamentary structure in which multiple composite cores in which a composite compound containing Nb$_3$Ga of a stoichiometric composition embedded in Nb are embedded in Nb, Ta, Nb-base alloy or Ta-base alloy as a matrix material is obtained.

36 Claims, 5 Drawing Sheets

NB₃GA MULTIFILAMENTARY SUPERCONDUCTING WIRE AND PROCESS FOR PREPARING THE SAME

FIELD OF THE INVENTION

The present invention relates to an $Nb_3Ga$ multifilamentary superconducting wire and a process for preparing the same. More particularly, the present invention relates to an $Nb_3Ga$ multifilamentary superconducting wire which has high Jc even at a high magnetic field and can be used for generation of a high magnetic field due to $Nb_3Ga$ with excellent superconductivity, which has a stoichiometric composition or in the vicinity thereof, and a process for preparing the same.

DESCRIPTION OF THE PRIOR ART $Nb_3Ga$ having a stoichiometric composition has been known as a superconducting material exhibiting excellent superconductivity and, as a process for preparing $Nb_3Ga$, there have been known various methods such as a melting method, a chemical vapor deposition (CVD) method, a sputtering method, a diffusing method and the like. Regarding $Nb_3Ga$, it has been known that $Nb_3Ga$ near a stoichiometric composition is produced at a high temperature and, by heat treatment at around 700° C., a long distance order degree of a crystal structure is improved, and a high superconducting transition temperature (Tc) of 19 to 20.7 K is exhibited.

However, by the previous methods, it is difficult to prepare $Nb_3Ga$ as a continuous wire and a multifilamentary wire has not been realized yet. Only a tape-like $Nb_3Ga$ superconducting wire has been reported. Though the tape-like $Nb_3Ga$ superconducting wire is prepared by producing superconducting $Nb_3Ga$ by means of a diffusing method, there is a problem that when $Nb_3Ga$ is produced at 1000° C. or higher, a crystal particle becomes coarse, and only a wire having a small critical current density (Jc) is obtained. Since Jc in a wire is the most important property for practical use, realization of an $Nb_3Ga$ superconducting wire having not only high Tc but also high Jc is expected.

The present invention has an object to provide an $Nb_3Ga$ multifilamentary superconducting wire which has high Jc even at a high magnetic field and can be used for generation of a high magnetic field due to $Nb_3Ga$ exhibiting the excellent superconductivity at a stoichiometric composition or in the vicinity thereof, and a process for preparing the same.

This and other objects, features and advantages of the invention will become more apparent upon reading of the following detailed specification and drawings, in which:

DETAILED DESCRIPTION OF THE INVENTION

Figure 1:
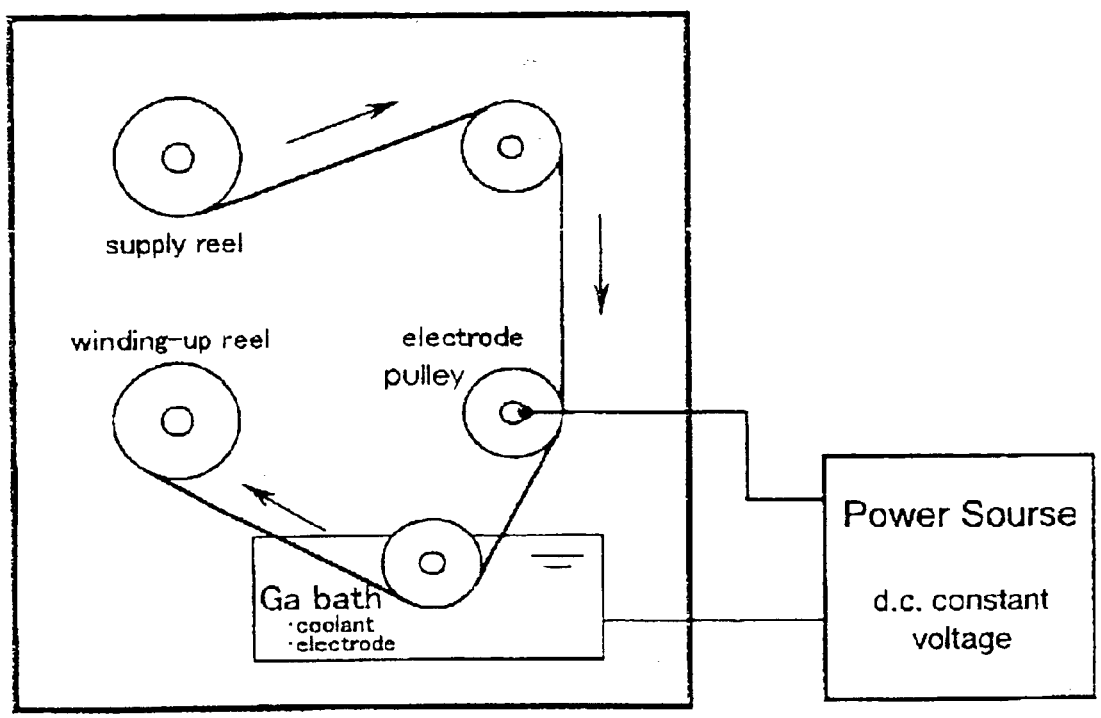
FIG. 1 is a view schematically illustrating a rapid heating and quenching apparatus.

An $Nb_3Ga$ multifilamentary superconducting wire provided by the present invention is a superconducting wire having a multifilamentary structure in which multiple composite cores in which a composite compound containing $Nb_3Ga$ having a stoichiometric composition is embedded in Nb are embedded in Nb, Ta, Nb-base alloy or Ta-base alloy as a matrix material. $Nb_3Ga$ in composite cores is produced as an A15 compound by diffusion production or melting solidification by rapid heating to a temperature range of 1400 to 2100° C. in 2 seconds and quenching at a rate of 5000° C./second or higher, and subjecting to additional heat treatment at a temperature of 600 to 850° C. for improving a crystal order degree.

In the $Nb_3Ga$ multifilamentary superconducting wire, a composite compound involves Nb and various Nb—Ga compounds outside stoichiometry in addition to $Nb_3Ga$. A ratio of $Nb_3Ga$ with a stoichiometric composition in a composite compound is not particularly limited. 10 and a few % to 100% is exemplified. More specifically, for example, in Examples described later, it is exemplified that a superconducting wire in which a ratio of $Nb_3Ga$ with a stoichiometric composition is from 20 to 40% can be realized.

The composite compound can constitute a composite core by embedding in Nb in various forms. The composite compound may be embedded in Nb as an integral body or an extra fine filament. When a composite compound is filamentous, an average outer diameter is preferably 1 μm or smaller.

In addition, a multiple number of composite cores are embedded in Nb, Ta, Nb-base alloy or Ta-base alloy as a matrix material to form a superconducting wire having a multifilamentary structure of the present invention. In the present invention, definition of "multiple" means from a few tens to a few millions.

Since the $Nb_3Ga$ multifilamentary superconducting wire of the present invention contains $Nb_3Ga$ with a stoichiometric composition at a high crystal order degree, the wire exhibits excellent superconductivity. The wire has a high superconducting transition temperature (Tc) comparative to that of bulk $Nb_3Ga$, a high superconducting second critical magnetic field (Hc2) and a high superconductivity critical current density (Jc). The superconductivity is, for example, Jc of 100 A/mm² or larger at 4.2 K and 24 T or smaller and is sufficient for use as a wire.

In the $Nb_3Ga$ multifilamentary superconducting wire of the present invention, an Ag core(s) may be embedded together with composite cores and a surface of the wire may be covered with Cu.

The Ag core(s) and Cu covering play a role in stabilizing a state where a electric current is flown in the $Nb_3Ga$ multifilamentary superconducting wire in the superconducting state. That is, generally, when an electric current is flown in a wire in a superconducting state, the electric current begins to flow on surfaces of composite cores and a wire and is not flown uniformly. This causes unstable state in which energy is stored in a wire. Wires are rubbed by each other and are moved. Accordingly, when energy in composite cores and a wire is locally released, superconductivity at the part is destroyed, Joule heat is generated, and destruction of a superconducting state is extended to a whole of composite cores and a wire. However, in the case where high purity Ag or Cu is contacted with composite cores and a wire, since an electric current is flown selectively in a high purity Ag or Cu in a part where superconductivity is destroyed (normal conductive part), a great deal of heat is not generated. During the flow of an electric current, a wire is quenched from a periphery and a normal conductive part is returned to superconductivity. By means of an Ag core(s) or Cu covering, a superconducting state is stably retained.

It is preferable that an Ag core(s) is embedded in the center of a superconducting wire and, for example, the Ag core(s) can be embedded at a ratio of from 5 to 40% relative to a cross-sectional area of a superconducting wire.

With respect to Cu covering, a composite amount can be adjusted at a ratio of from 5 to 1000% of a cross-sectional area depending on use of a superconducting wire. A most suitable composite amount is from 10 to 20%, for example, in the case of a law magnetic field wire and, in the case of a high magnetic field wire, the amount is from 80 to 90% of a cross-sectional area.

The superconducting wire of the present invention can be prepared by a process for preparing an $Nb_3Ga$ multifilamentary superconducting wire of the present invention described below.

A process for preparing an $Nb_3Ga$ multifilamentary superconducting wire provided of the present invention comprises the steps of rapidly heating a precursor wire having a multifilamentary structure in which multiple composite cores in which a composite compound of an Nb—Ga compound and Nb is embedded in Nb are embedded in Nb, Ta, Nb-base alloy or Ta-base alloy as a matrix material to a temperature range of 1400 to 2100° C. in 2 seconds, quenching the precursor wire at a rate of 5000° C./second or larger, and subjecting the precursor wire to additional heating treatment at a temperature range of 600 to 850° C. for 1 to 400 hours.

In the composite cores, a composite compound of an Nb—Ga compound and Nb to be embedded in Nb, which produces $Nb_3Ga$ by a diffusion reaction or melting solidification by rapid heating and quenching treatment at a post-step, can be used. The Nb—Ga compound may be selected from various Nb—Ga compounds and, specifically, may be one or more selected from $NbGa_3$, $Nb_5Ga_{13}$, $Nb_4Ga_5$, NbGa, $Nb_5Ga_4$, $Nb_3Ga_4$, $Nb_5Ga_3$, $Nb_2Ga$ and $Nb_3Ga$. Intermediate compound of them may be possible.

The composite compound of the Nb—Ga compound and Nb can be prepared by complexing an Nb—Ga compound and Nb. In the present invention, simple preparation of a composite compound of an Nb—Ga compound and Nb is exemplified. That is, the preparation is a process in which an Nb wire is covered with Ga and the wire is subjected to heat treatment. The heat treatment can be performed in such a temperature range that Ga is easily diffused into Nb. From a viewpoint of cost, a lower temperature is desirable. Therefore, for example, the temperature range is from 650 to 1000° C. A composite compound in which a surface of an Nb wire is changed to an Nb—Ga compound by a diffusing reaction can be obtained.

The composite compound of an Nb—Ga compound and Nb can be embedded in Nb by various methods such as a powder filling method, a jelly roll method, a clad chipping method, a rod in tube method and the like.

Multiple composite cores in which the composite compound is embedded in Nb are embedded in Nb, Ta, Nb-base alloy or Ta-base alloy as a matrix material to obtain a precursor wire having a multifilamentary structure. The Nb, Ta, Nb-base alloy or Ta-base alloy should be selected in light of excellence in cold processibility for forming a multifilamentary structure and sufficient mechanical strength even at 1800° C. or higher, further around 2,000° C. In this mean, Nb or Ta alone is preferable for a matrix material. With respect to Nb-base alloy or Ta-base alloy, a dilute alloy is preferable. In the dilute alloy, the content of an alloy element is 3% or smaller in the case of single element, 5% or smaller at a total and the content of Nb or Ta is 95% or larger.

A form of the multifilamentary structure and a preparation process are not particularly limited. For example, multiple composite cores are bundled and placed in a tube composed of the aforementioned matrix material and the tube is subjected to groove roll processing and wire-stretching processing. A form of a composite core in the above case may be selected from various forms such as a circular shape, an elliptic shape, a rectangular shape, a wedge shape and similar shapes in a cross-section.

In the present invention, a precursor wire having the aforementioned multifilamentary structure is subjected to rapid heating and quenching treatment in which the precursor wire is rapidly heated to a temperature range of from 1400 to 2100° C. where $Nb_3Ga$ is stably produced and exists, more preferably to a temperature range of from 1400 to 1860° C. in 2 seconds, and quenched at a rate of 5,000° C./second or larger.

A heat temperature of lower than 1400° C. is not preferable because $Nb_3Ga$ with a stoichiometric composition or in the vicinity thereof cannot be obtained. A heat temperature exceeding 2100° C. is not preferable because $Nb_3Ga$ is not stable and a wire may be broken. Long time heating and cooling is not preferable because produced $Nb_3Ga$ becomes coarse and a Jc property of a resulting superconducting wire is reduced.

$Nb_3Ga$ is produced as an A15 compound crystal, but a crystallization order is not relatively high. In order to enhance a long distance order degree of an A15 compound crystal, additional heat treatment is performed in a temperature range of 600 to 850° C. for 1 to 400 hours. As a result, in the present invention, an $Nb_3Ga$ multifilamentary superconducting wire having a firm crystallization order of an A15 compound and excellent superconductivity is realized.

In the present invention, superconductivity of a resulting $Nb_3Ga$ multifilamentary superconducting wire can be stabilized by using a precursor wire containing an Ag core(s) together with composite cores or covering a surface of a wire with Cu after quenching.

The Ag core(s), as described above, can be contained in a precursor wire by placing it together with multiple composite cores in a tube composed of a matrix material. It is preferable that the Ag core(s) is disposed at the center of a superconducting wire and, for example, the Ag core(s) is used at a ratio of from 5 to 40% relative to a cross-sectional area of a superconducting wire.

Covering with Cu can be performed, for example, at a ratio of around 5 to 1000% relative to a cross-sectional area of a superconducting wire. The Cu covering can be performed by various methods. For example, by covering a surface of a wire with Cu at a thickness of 0.1 $\mu$m or larger by means of ionplating and further covering a surface of Cu at a thickness of a few tens to a few hundreds $\mu$m by means of plating, a surface of a wire and Cu is joined with a better interface and an $Nb_3Ga$ multifilamentary superconducting wire having higher stability can be obtained. Cu covering by means of ionplating functions as a primary coat for plating because of a better interface between a surface of a wire and Cu. Therefore, for example, Cu covering can be performed without necessity of additional heat treatment. A thickness of Cu covering by means of ionplating is not preferable when the thickness is smaller than 0.1 μm. This is because better Cu/Nb joint cannot be obtained and sufficient stability is not obtained.

On the other hand, covering with Cu can be also performed by plating a surface of a wire with Cu or inserting a wire into a Cu tube, sealing both ends, and performing hot isostatic press (HIP) at a temperature of 500° C. or higher under an inert gas atmosphere at 100 atm or higher. As an inert gas atmosphere, rare gases such as He, Ne, Ar and the like and $N_2$ can be used. HIP under conditions of an inert gas atmosphere at less than 100 atm or at lower than 500° C. is not preferable because a joining reaction between a surface of a wire and Cu plating or a Cu tube hardly proceeds. Alternatively, HIP treatment at from 600 to 850° C. is adopted as an additional heat treatment mentioned above.

Excellent superconductivity of an $Nb_3Ga$ multifilamentary superconducting wire is more stable.

The aforementioned $Nb_3Ga$ multifilamentary superconducting wire provided by the present invention realizes a multifilamentary superconducting wire with high Tc of $Nb_3Ga$ and is excellent in important Hc2 and Jc properties in putting into practice. These properties are recognized as being excellent in comparison with metallic practical wires, and being approximately equivalent to properties of oxide superconducting continuous wires. Besides, the wire of the present invention is extremely excellent in respect of reliance and manufacturing cost.

EXAMPLES

Example 1

Figure 2:
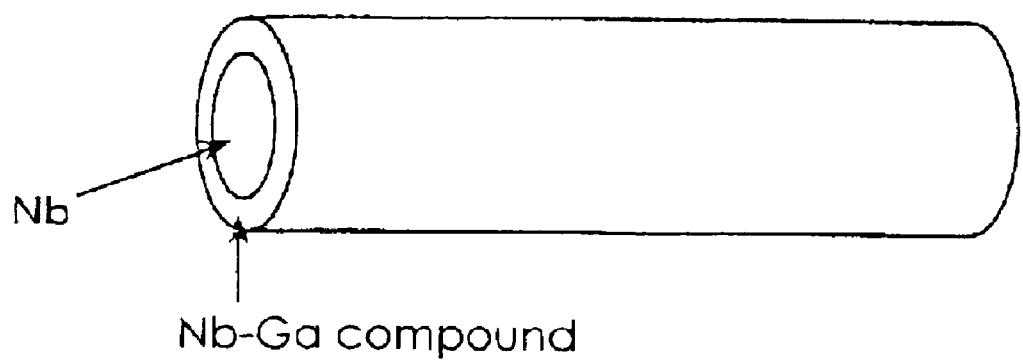
FIG. 2 is a view illustrating a construction of an Nb/Nb—Ga compound composite.

Using a rapid heating and quenching apparatus as shown in FIG. 1, a surface of an Nb wire having a diameter of 0.3 mm was subjected to Ga plating. The Nb wire was rapidly heated to around 2000° C. by electric heat between a Ga bath and an electrode pulley and was quenched while passing through a Ga bath and, at the same time, was covered with Ga. When obtained wire was heat-treated at 700° C. for 2 hours, a surface of the Nb wire was changed to an Nb—Ga compound by a diffusing reaction and it was confirmed that an Nb/Nb—Ga compound composite wire was obtained. A construction of the Nb/Nb—Ga compound composite wire is shown in FIG. 2. A main component of the Nb/Nb—Ga compound was $NbGa_3$.

Figure 3:
FIG. 3 is a view schematically illustrating placement of an Nb/Nb—Ga compound composite wire in an Nb pipe.

The Nb/Nb—Ga compound composite wire was cut into a length of 120 mm and 1000 of composite wires were inserted into an Nb pipe, which has an internal diameter of 14 mm and an external diameter of 20 mm, to obtain a composite wire. The composite wire is shown in FIG. 3. The composite wire was processed into a thin wire having a diameter of 0.7 mm by groove roll processing and stretching processing and cut into a length of 120 mm. 200 of composite wires were inserted into an Nb pipe having an internal diameter of 14 mm and an external diameter of 20 mm and the pipe was subjected to groove roll processing and stretching processing to obtain an multifilamentary precursor wire having 200 cores.

Using an rapid heating and quenching apparatus shown in FIG. 1, the precursor wire was subjected to rapid heating and quenching treatment by rapidly heating to a high temperature from 1300 to 1900° C. for 0.1 second and immediately passing through a Ga bath. Ga plated on a surface of the precursor wire by rapid heating and quenching treatment was dissolved and removed with hydrochloric acid and was subjected to additional heat treatment at 600 to 800° C. for 100 hours in an inert atmosphere. Maximum reaching temperatures and additional heat treatment conditions in rapid heating and quenching treatment are shown in Table 1.

Multifilamentary wires after additional heat treatment were examined by X ray diffraction. It was confirmed that diffraction pattern peculiar to an A15 compound was contained. Further, superconducting transition temperatures (Tc) of the multifilamentary wires were examined by a resistance method. The results are shown in Table 1.

TABLE 1

| Maximum reaching temperature (° C.) | Additional heat treatment conditions | Tc (K) | Hc2 (4.2 k) (T) |
|---|---|---|---|
| 1900 | None | 15.2 | 22.8 |
|  | 850° C. × 1 Hour | 17.9 | 26.3 |
|  | 800° C. × 2 Hour | 18.5 | 28.5 |
|  | 750° C. × 4 Hour | 18.7 | 29.2 |
|  | 700° C. × 8 Hour | 18.9 | 29.7 |
|  | 700° C. × 20 Hour | 19 | 29.8 |
|  | 650° C. × 50 Hour | 18.7 | 28.3 |
|  | 600° C. × 100 Hour | 18.6 | 27.6 |
|  | 600° C. × 400 Hour | 18.8 | 28.9 |
| 1800 | None | 15.6 | 24.1 |
|  | 850° C. × 1 Hour | 19.1 | 29.9 |
|  | 800° C. × 2 Hour | 19.3 | 30.4 |
|  | 750° C. × 4 Hour | 19.5 | 31.4 |
|  | 700° C. × 8 Hour | 19.7 | 32 |
|  | 700° C. × 20 Hour | 19.7 | 32.1 |
|  | 650° C. × 50 Hour | 19.5 | 31.5 |
|  | 600° C. × 100 Hour | 19.1 | 30.2 |
|  | 600° C. × 400 Hour | 19.6 | 31.2 |
| 1700 | None | 15.6 | 24 |
|  | 850° C. × 1 Hour | 19 | 29.5 |
|  | 800° C. × 2 Hour | 19.4 | 30.8 |
|  | 750° C. × 4 Hour | 19.6 | 31.7 |
|  | 700° C. × 8 Hour | 19.7 | 32.1 |
|  | 700° C. × 20 Hour | 19.7 | 32.2 |
|  | 650° C. × 50 Hour | 19.6 | 31.7 |
|  | 600° C. × 100 Hour | 19.2 | 30.5 |
|  | 600° C. × 400 Hour | 19.6 | 31.1 |
| 1500 | None | 12.3 | 16.5 |
|  | 850° C. × 1 Hour | 15 | 25.3 |
|  | 800° C. × 2 Hour | 16.2 | 26.4 |
|  | 750° C. × 4 Hour | 16.5 | 27.1 |
|  | 700° C. × 8 Hour | 16.8 | 27.3 |
|  | 700° C. × 20 Hour | 16.8 | 27.3 |
|  | 650° C. × 50 Hour | 16.4 | 26.2 |
|  | 600° C. × 100 Hour | 16.4 | 26.5 |
|  | 600° C. × 400 Hour | 16.7 | 27.3 |
| 1300 | None | 9.9 | 5.5 |
|  | 850° C. × 1 Hour | 10.4 | 7.3 |
|  | 800° C. × 2 Hour | 10.9 | 8.2 |
|  | 750° C. × 4 Hour | 11.3 | 10.3 |
|  | 700° C. × 8 Hour | 12.5 | 11.5 |
|  | 700° C. × 20 Hour | 12.7 | 12.2 |
|  | 650° C. × 50 Hour | 12.1 | 11.3 |
|  | 600° C. × 100 Hour | 12.3 | 10.9 |
|  | 600° C. × 400 Hour | 12.6 | 12.3 |

From Table 1, it was confirmed that some multifilamentary wires exhibiting Tc reaching 19.7 K were obtained. It has been reported that an A15 compound $Nb_3Ga$ in Nb—Ga compounds has Tc of 12.0 to 20.7 K. It was confirmed that $Nb_3Ga$ is formed in the multifilamentary wires.

Figure 4:
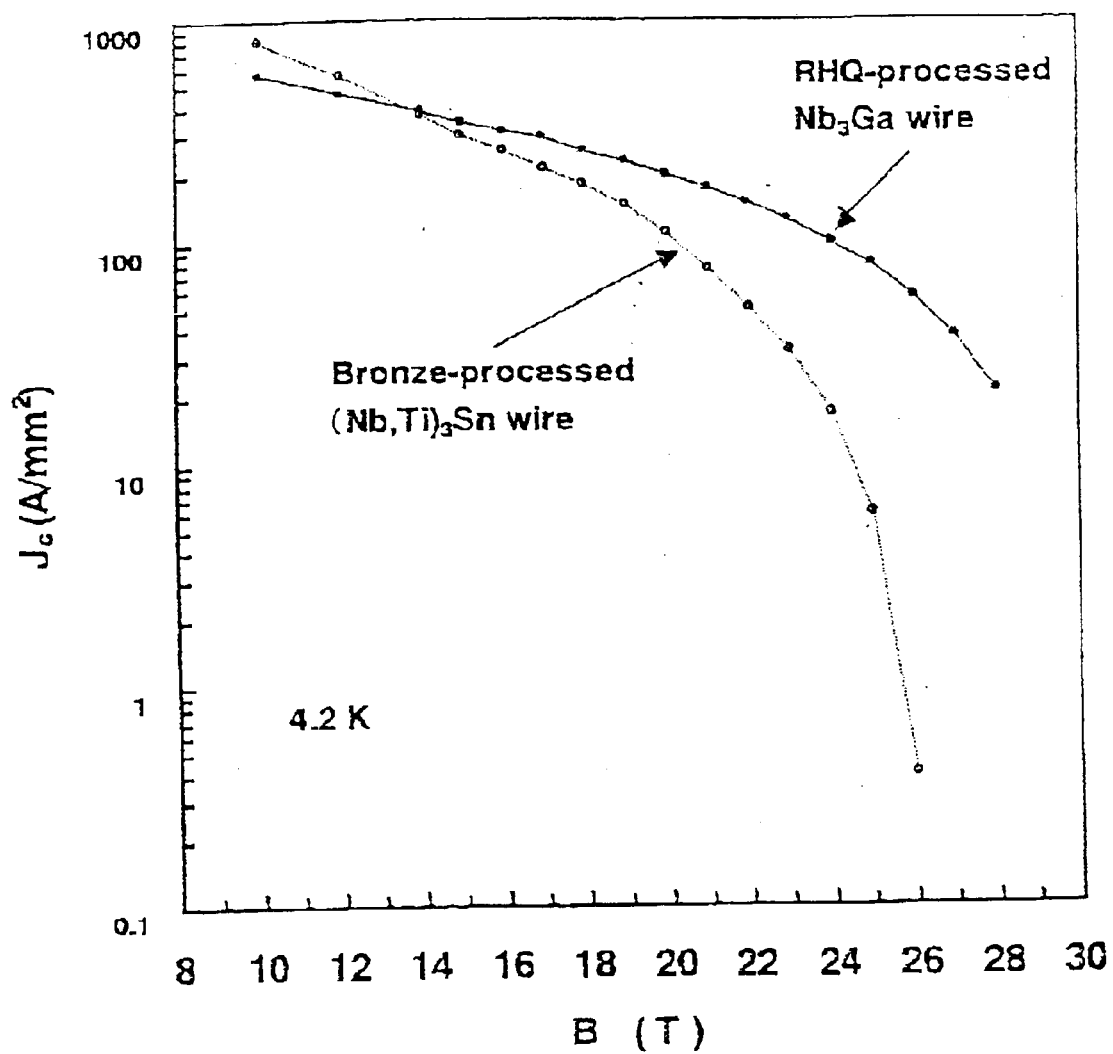
FIG. 4 is a view illustrating superconducting critical current density (Jc) of an $Nb_3Ga$ multifilamentary superconducting wire of the present invention and an $(Nb, Ti)_3Sn$ multifilamentary wire by a bronze method, which is a practical superconducting wire.

Regarding the $Nb_3Ga$ multifilamentary wire and a $(Nb, Ti)_3Sn$ multifilamentary wire by a bronze method, which is a practical superconducting wire, a superconducting critical current density (Jc) was measured. The results are shown in FIG. 4. The $Nb_3Ga$ multifilamentary wire showed higher Jc value at a magnetic field 14 T or higher than the $(Nb, Ti)_3Sn$ multifilamentary wire showed. Jc at up to 24 T is 100 A/mm² or larger. It was confirmed that the wire has sufficient Jc as a practical wire.

It is known that Jc value of a superconducting compound generally grows larger in the case of a fine crystal particle having a high critical grain boundary density which serves as a pinning point of a quantum magnetic flux line. From this, it is presumed that $Nb_3Ga$ prepared by rapid heating and quenching treatment in the $Nb_3Ga$ multifilamentary wire is composed of fine crystal particles. The aforementioned Tc values are within a range of the values reported for $Nb_3Ga$, but the Jc values are higher than the values reported for $Nb_3Ga$ prepared by a melting method, a CVD method, a sputtering method, a diffusing method and the like. Further, the $Nb_3Ga$ multifilamentary wire has extremely high Jc at a high magnetic field. That is, Hc2 (4.2 K) of this $Nb_3Ga$ multifilamentary wire is 32 T and is considerably higher than Hc2(4.2 K)=26 T of the $(Nb, Ti)_3Sn$ multifilamentary wire. It is considered that $Nb_3Ga$ having a fine tissue was produced and a strong pinning center was introduced.

Example 2

Figure 5:
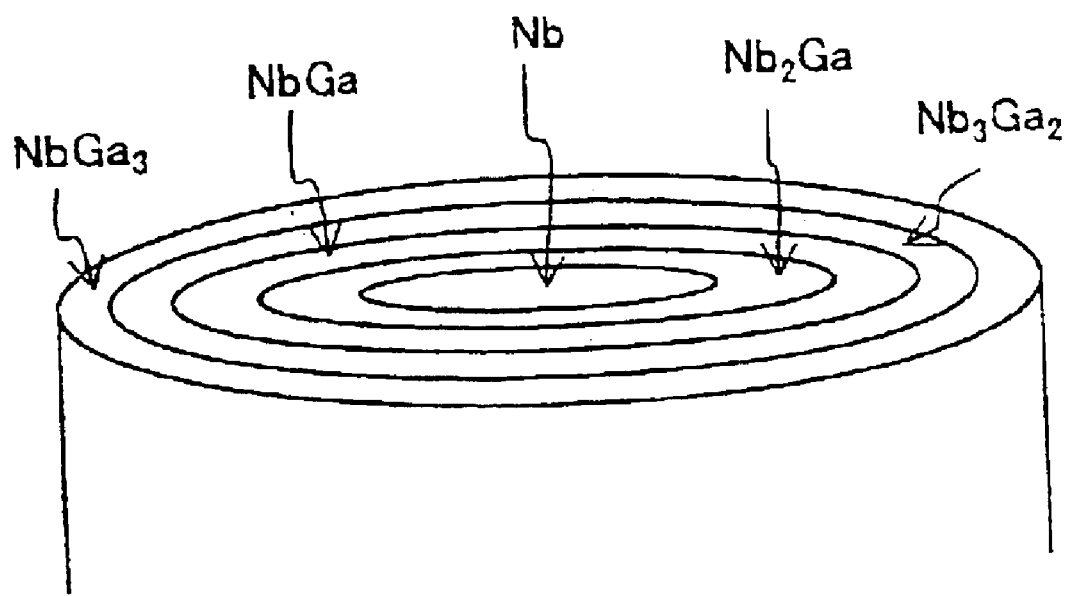
FIG. 5 is a view schematically illustrating a composite wire in which a plurality of Nb—Ga compounds are formed as a multi-layered structure on a surface of an Nb wire.

Ga was plated on an Nb wire and the wire was heat-treated at 900° C. for 1 hour according to the same manner as in Example 1. As illustrated in FIG. 5, a composite wire was obtained having a multi-layered structure of an $Nb_2Ga$ layer, an NbGa layer, an $Nb_3Ba_2$ layer and an $NbGa_3$ layer on a surface of the Nb wire. These layers were arranged orderly from a center.

According to the same manner as in Example 1, the composite wire was employed to prepare a multifilamentary precursor wire composed of $Nb/Nb_2Ga/NbGa/Nb_3Ga_2/NbGa_3$. When the precursor wire was subjected to rapid heating and quenching treatment as in Example 1, a multifilamentary wire exhibiting the similar superconducting property to that of the wires in Example 1 was obtained.

Example 3

According to the same manner as in Example 1, a Ta pipe was employed in place of an Nb pipe and a multifilamentary precursor wire having a matrix of Ta was prepared. When the precursor wire was subjected to rapid heating and quenching treatment as in Example 1, a multifilamentary wire exhibiting a superconducting property equivalent to that of the wires in Example 1 was obtained.

Example 4

According to the same manner as in Example 1, when a composite wire having 1000 cores was inserted into an Nb pipe, 7 of Ag wires having an outer diameter of 2 mm, which were covered with Nb, were incorporated at a position near a center and 110 of multifilamentary wires having 1000 cores were incorporated around the Ag wires. By groove roll processing and stretching processing, a multifilamentary precursor wire was prepared. The precursor wire was subjected to rapid heating and quenching treatment as in Example 1. Ag and Nb in a wire did not react and Ag remained as an electric conductor at the center of a multifilamentary wire.

Although a superconducting property of the multifilamentary wire was almost the same as in Example 1, a resistance value when a superconducting state was destroyed was reduced to 1/30 or smaller as compared with Example 1. From this, it was confirmed that since, in the case of superconductivity destruction, a current is branched into Ag at a center of the multifilamentary wire and production of Joule heat is suppressed, the multifilamentary wire was stabilized.

Example 5

A surface of the $Nb_3Ga$ multifilamentary wire prepared in Example 1 was plated with Cu at a thickness of around 20 $\mu m$. When an interface between Nb and Cu was examined, cracks were confirmed. When a superconducting property was examined in the state as it is, it was seen that the interface is not electrically, thermally and chemically connected well and the wire was not stabilized.

Then, Cu plating was performed before additional heating treatment. It was confirmed that a superconducting property of a resulting Cu-plated $Nb_3Ga$ multifilamentary wire and a property at a time of superconductivity destruction were stabilized.

Example 6

A surface of the $Nb_3Ga$ multifilamentary wire prepared in Example 1 was ionplated with Cu at a thickness of 0.1 $\mu m$, Cu was electrically plated on a surface of Cu. It was confirmed that an Nb/Cu interface having extremely better joint was obtained and a superconducting state was stabilized. On the other hand, in the case where a thickness of Cu by means of ionplating was set at 0.05 $\mu m$, joint of an Nb/Cu interface was bad and an excellent superconducting state could not be obtained.

Example 7

A sample was made by plating a surface of the $Nb_3Ga$ multifilamentary wire in Example 1 with copper. Another sample was made by covering a whole of the $Nb_3Ga$ multifilamentary wire with a Cu tube and sealing both ends of the tube by welding. These samples were subjected to HIP treatment at 600° C. for 2 hours in an Ar atmosphere at 500 atm.

In resulting Cu-covered $Nb_3Ga$ multifilamentary wires, it was confirmed in both cases that an Nb/Cu interface having good joint was obtained and a superconducting state was stabilized. However, by HIP treatment at 500° C. or lower or at 50 atoms or lower, a good Nb/Cu interface was not obtained and a superconducting state was not stabilized.

Of course, the present invention is not limited to the aforementioned Examples. Various modifications are possible regarding details.

What is claimed is:

1. An $Nb_3Ga$ multifilamentary superconducting wire having a multifilamentary structure in which multiple composite cores in which a composite compound containing $Nb_3Ga$ having a stoichiometric composition is embedded in Nb are embedded in Nb, Ta, Nb-base alloy or Ta-base alloy as a matrix material, wherein $Nb_3Ga$ in the composite cores is produced as an A15 compound by rapid heating to a temperature range of 1400 to 2100° C. in 2 seconds or shorter and quenching at a rate of 5000° C./second or larger, and has a crystal order degree improved by additional heat treatment at a temperature of 600 to 850° C.

2. The $Nb_3Ga$ multifilamentary superconducting wire according to claim 1, wherein an Ag core(s) together with composite cores is embedded in the superconducting wire.

3. The $Nb_3Ga$ multifilamentary superconducting wire according to claim 1, wherein a surface is covered with Cu.

4. The $Nb_3Ga$ multifilamentary superconducting wire according to claim 2, wherein a surface is covered with Cu.

5. A process for preparing an $Nb_3Ga$ multifilamentary superconducting wire, which comprises the steps of rapidly heating a precursor wire having a multifilamentary structure in which multiple composite cores in which a composite compound of an Nb—Ga compound and Nb is embedded in Nb are embedded in Nb, Ta, Nb-base alloy or Ta-base alloy as a matrix material to a temperature range of 1400 to 2100° C. in 2 seconds, quenching the precursor wire at a rate of 5000° C./second or larger, and subjecting the precursor wire to additional heat treatment at a temperature range of 600 to 850° C. for 1 to 400 hours.

6. The process for preparing an $Nb_3Ga$ multifilamentary superconducting wire according to claim 5, wherein the Nb—Ga compound is one or more selected from the group consisting of $NbGa_3$, $Nb_5Ga_{13}$, $Nb_4Ga_5$, $NbGa$, $Nb_5Ga_4$, $Nb_3Ga_4$, $Nb_5Ga_3$, $Nb_2Ga$ and $Nb_3Ga$.

7. The process for preparing an $Nb_3Ga$ multifilamentary superconducting wire according to claim 5, wherein the composite compound of an Nb—Ga compound and Nb is the one in which an Nb wire is covered with Ga and is heat-treated.

8. The process for preparing an $Nb_3Ga$ multifilamentary superconducting wire according to claim 6, wherein the composite compound of an Nb—Ga compound and Nb is the one in which an Nb wire is covered with Ga and is heat-treated.

9. The process for preparing an $Nb_3Ga$ multifilamentary superconducting wire according to claim 5, wherein the precursor wire contains an Ag core(s) together with composite cores.

10. The process for preparing an $Nb_3Ga$ multifilamentary superconducting wire according to claim 6, wherein the precursor wire contains an Ag core(s) together with composite cores.

11. The process for preparing an $Nb_3Ga$ multifilamentary superconducting wire according to claim 7, wherein the precursor wire contains an Ag core(s) together with composite cores.

12. The process for preparing an $Nb_3Ga$ multifilamentary superconducting wire according to claim 8, wherein the precursor wire contains an Ag core(s) together with composite cores.

13. The process for preparing an $Nb_3Ga$ multifilamentary superconducting wire according to claim 5, wherein after quenching, a surface of the wire is covered with Cu.

14. The process for preparing an $Nb_3Ga$ multifilamentary superconducting wire according to claim 6, wherein after quenching, a surface of the wire is covered with Cu.

15. The process for preparing an $Nb_3Ga$ multifilamentary superconducting wire according to claim 7, wherein after quenching, a surface of the wire is covered with Cu.

16. The process for preparing an $Nb_3Ga$ multifilamentary superconducting wire according to claim 8, wherein after quenching, a surface of the wire is covered with Cu.

17. The process for preparing an $Nb_3Ga$ multifilamentary superconducting wire according to claim 9, wherein after quenching, a surface of the wire is covered with Cu.

18. The process for preparing an $Nb_3Ga$ multifilamentary superconducting wire according to claim 10, wherein after quenching, a surface of the wire is covered with Cu.

19. The process for preparing an $Nb_3Ga$ multifilamentary superconducting wire according to claim 11, wherein after quenching, a surface of the wire is covered with Cu.

20. The process for preparing an $Nb_3Ga$ multifilamentary superconducting wire according to claim 12, wherein after quenching, a surface of the wire is covered with Cu.

21. The process for preparing an $Nb_3Ga$ multifilamentary superconducting wire according to claim 13, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

22. The process for preparing an $Nb_3Ga$ multifilamentary superconducting wire according to claim 14, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

23. The process for preparing an $Nb_3Ga$ multifilamentary superconducting wire according to claim 15, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

24. The process for preparing an $Nb_3Ga$ multifilamentary superconducting wire according to claim 16, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

25. The process for preparing an $Nb_3Ga$ multifilamentary superconducting wire according to claim 17, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

26. The process for preparing an $Nb_3Ga$ multifilamentary superconducting wire according to claim 18, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

27. The process for preparing an $Nb_3Ga$ multifilamentary superconducting wire according to claim 19, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

28. The process for preparing an $Nb_3Ga$ multifilamentary superconducting wire according to claim 20, wherein covering with Cu is performed by covering the surface of the wire with Cu at a thickness of 0.1 $\mu$m or larger by means of ionplating, and further covering a surface of Cu covered at a thickness of a few tens to a few hundreds $\mu$m by means of plating.

29. The process for preparing an $Nb_3Ga$ multifilamentary superconducting wire according to claim 13, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

30. The process for preparing an $Nb_3Ga$ multifilamentary superconducting wire according to claim 14, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

31. The process for preparing an $Nb_3Ga$ multifilamentary superconducting wire according to claim 15, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

32. The process for preparing an $Nb_3Ga$ multifilamentary superconducting wire according to claim 16, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

33. The process for preparing an $Nb_3Ga$ multifilamentary superconducting wire according to claim 17, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

34. The process for preparing an $Nb_3Ga$ multifilamentary superconducting wire according to claim 18, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

35. The process for preparing an $Nb_3Ga$ multifilamentary superconducting wire according to claim 19, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

36. The process for preparing an $Nb_3Ga$ multifilamentary superconducting wire according to claim 20, wherein covering with Cu is performed by plating the surface of the wire with Cu, or covering with Cu is performed by inserting the wire into a Cu tube, sealing both ends of the tube, and performing HIP treatment at a temperature of 500° C. or higher under an inert gas atmosphere at 100 atm or higher.

* * * * *